United States Patent [19]

Om

[11] Patent Number: 5,793,212

[45] Date of Patent: Aug. 11, 1998

[54] METHOD OF MEASURING THE BREAKDOWN CHARGE OF A DIELECTRIC FILM

[75] Inventor: Kum-Yong Om, Kyoungki-do, Rep. of Korea

[73] Assignee: Hyundai Electronics Industries Co., Ltd., Ich'on, Rep. of Korea

[21] Appl. No.: 814,687

[22] Filed: Mar. 11, 1997

Related U.S. Application Data

[63] Continuation of Ser. No. 581,247, Dec. 29, 1995, abandoned.

[30] Foreign Application Priority Data

Dec. 31, 1994 [KR] Rep. of Korea .................. 1994 40313

[51] Int. Cl.$^6$ .................................................. G01R 31/26
[52] U.S. Cl. ........................... 324/537; 324/765; 324/719
[58] Field of Search .................................. 324/663, 678, 324/765, 766, 767, 537, 551, 452, 717, 719

[56] References Cited

U.S. PATENT DOCUMENTS

| | | | |
|---|---|---|---|
| 3,840,809 | 10/1974 | Yun | 324/765 |
| 3,995,216 | 11/1976 | Yun | 324/765 |
| 4,978,915 | 12/1990 | Andrews, Jr. et al. | 324/765 |
| 5,023,561 | 6/1991 | Hillard | 324/765 X |
| 5,285,151 | 2/1994 | Akama et al. | 324/765 |
| 5,420,513 | 5/1995 | Kimura | 324/765 X |

*Primary Examiner*—Ernest F. Karlsen
*Assistant Examiner*—Diep Do
*Attorney, Agent, or Firm*—Ware, Fressola, Van Der Sluys & Adolphson LLP

[57] ABSTRACT

A method for testing the reliability of a dielectric film on semiconductor substrate comprises of the steps of: establishing a current value corresponding to a first order, an order being defined as the selected current applied within a preselected set time-increment, in which the current is first applied for testing the reliability of the dielectric film deposited on the semiconductor substrate; applying the established current of the first order to the dielectric film; applying the next current corresponding to each of the subsequent orders until the dielectric film is broken down, wherein the current value corresponding to each of the subsequent orders is increased in steps over the subsequent orders; and measuring the charge value until the dielectric film is broken down, wherein the current value corresponding to each of the orders is divided by a predetermined denominator value and each of the divided values are applied cumulatively in sub-steps with the order to the dielectric film a number of times equal to the denominator value, and wherein the measurement on whether the dielectric film is broken down is carried out at a predetermined time after the current of the divided value is applied to the dielectric film.

3 Claims, 5 Drawing Sheets

1

METHOD OF MEASURING THE BREAKDOWN CHARGE OF A DIELECTRIC FILM

This application is a continuation of application Ser. No. 08/581,247 filed on Dec. 29, 1995, now abandoned.

TECHNICAL FIELD

The present invention relates generally, to a method for testing the reliability of a dielectric film deposited on a semiconductor substrate, and more particularly, to a method for testing the reliability of a gate oxide film sample deposited on a semiconductor substrate, wherein a current is applied between the gate and substrate of the MOS-C test structure until the gate oxide film sample breaks down.

BACKGROUND OF INVENTION

In the prior art, generally when a oxide film is formed, each oxide film formed in the oxidation steps in the fabrication of a semiconductor device, is subjected to measurements for various characteristics such as a surface inspection, a thickness test, a stress test, a refractive index test, cleanliness, and the like.

Moreover, in the process of semiconductor fabrication, the thin oxide film, in particular the gate oxide that is deposited on the semiconductor substrate, acts as an insulator, and in order to ensure the reliability of this thin oxide film, various reliablity tests must be performed. The reliability issues regarding the thin oxide generally fall into two categories and are as follows:

a. Dielectric breakdown which causes catastrophic failure of the device.

b. Hot-carrier-injection degradation resulting in the device measurements being degraded.

To determine the breakdown measurements of the gate oxide, various types of tests have been used. A typical method used in testing the reliability of the gate oxide is the Constant Current Stress Test (CCST). In the CCST method, a preset current is injected into the insulator and the current value is held constant during the course of the test. Voltage and time are recorded until the voltage suddenly drops. If there is a single oxide sample in the test, the oxide reliability is then characterized from the length of time elapsed to when breakdown occurred. However, if there is a group of oxide samples of the same area and thickness in the test, the cumulative failure percentage is calculated with the percentage being the fractional part from a group of samples that will fail prior to a specific time t. Thereafter, the time-to-failure data from the CCST test above are plotted on a cumulative percentage failure graph, with the breakdown time expressed on the vertical axis and the cumulative percentage failure expressed on the horizontal axis, as shown in FIG. 1. Referring to FIG. 1, the samples used in the test are a group of gate oxides of an area of 200×200 μm² and a thickness of 100 Å. The symbol "○" represents the result when tested after the gate oxides are treated with NH₄OH. The symbol "△" represents the result when tested after the gate oxides are treated with HF. In FIG. 1, those results falling within the boundaries defined by the ellipse are determined as the intrinsic failure characteristic of oxide films.

In the CCST method, the oxide reliability is determined by only measuring the intrinsic failure. Therefore, this method has a serious problem in reliability resolution that results from the high current per unit area of the oxide film. For example, if a current of 100 mA/cm² is applied to the oxide film, the precise charge value at which the oxide film is broken down cannot be detected. Thus, the measurement of the oxide reliability is not particularly precise.

Recently, from the fact that semiconductor devices have become highly integrated, for example a 64 Mb DRAM, it has become necessary to measure the extrinsic failures, such as those resulting from defects formed on the oxide film during the process, trapping or generation of the pinhole, and the formed defect center, in addition to measuring the intrinsic failure of the oxide film.

DISCLOSURE OF INVENTION

Accordingly, it is an object of the present invention to provide a method for testing the dielectric film, where the determination of the dielectric film reliability is not only more accurate by detecting the precise charge value at which the dielectric film is broken down, but where the extrinsic failure is also measured simultaneously.

To achieve the above object, the present invention provides a method for testing the reliability of a dielectric film, comprising the steps of:

establishing a current value corresponding to a first order, an order being defined as a selected current applied within a preselected set time-increment, in which the current is first applied for testing the reliability of the dielectric film deposited on a semiconductor substrate;

applying the selected current of the first order to the dielectric film;

applying a next current corresponding to each of a plurality of subsequent orders until the dielectric film is broken down, wherein a current value corresponding to each of the subsequent orders is increased over a previous order with continuation of the subsequent orders; and measuring a charge value until the dielectric film is broken down, wherein the current value corresponding to each of the orders is divided by a predetermined divisor and each of the divided values are applied cumulatively to the dielectric film a number of times equal to the divisor, and wherein the measurement on whether the dielectric film is broken down is carried out at a predetermined time after the current of the divided value is applied to the dielectric film.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
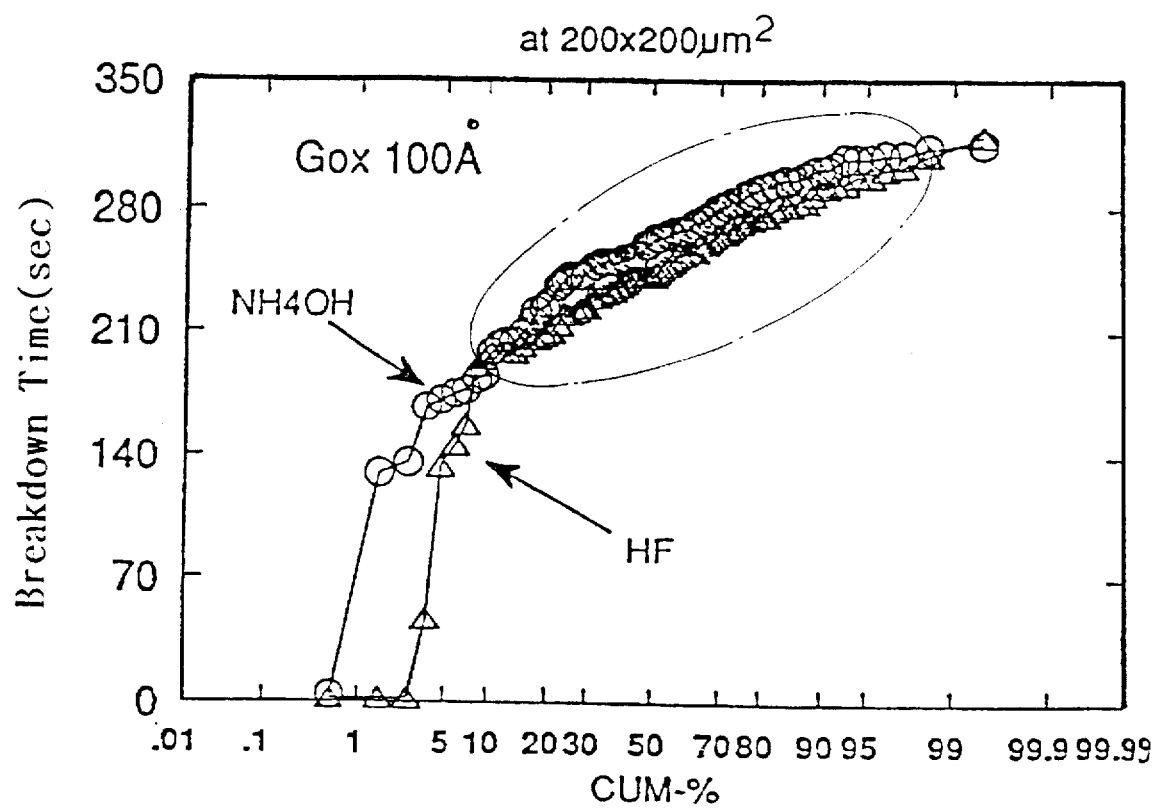
FIG. 1. is a graph showing results obtained by measuring the breakdown time of the dielectric film in accordance with the prior art CCST method.
Figure 2:
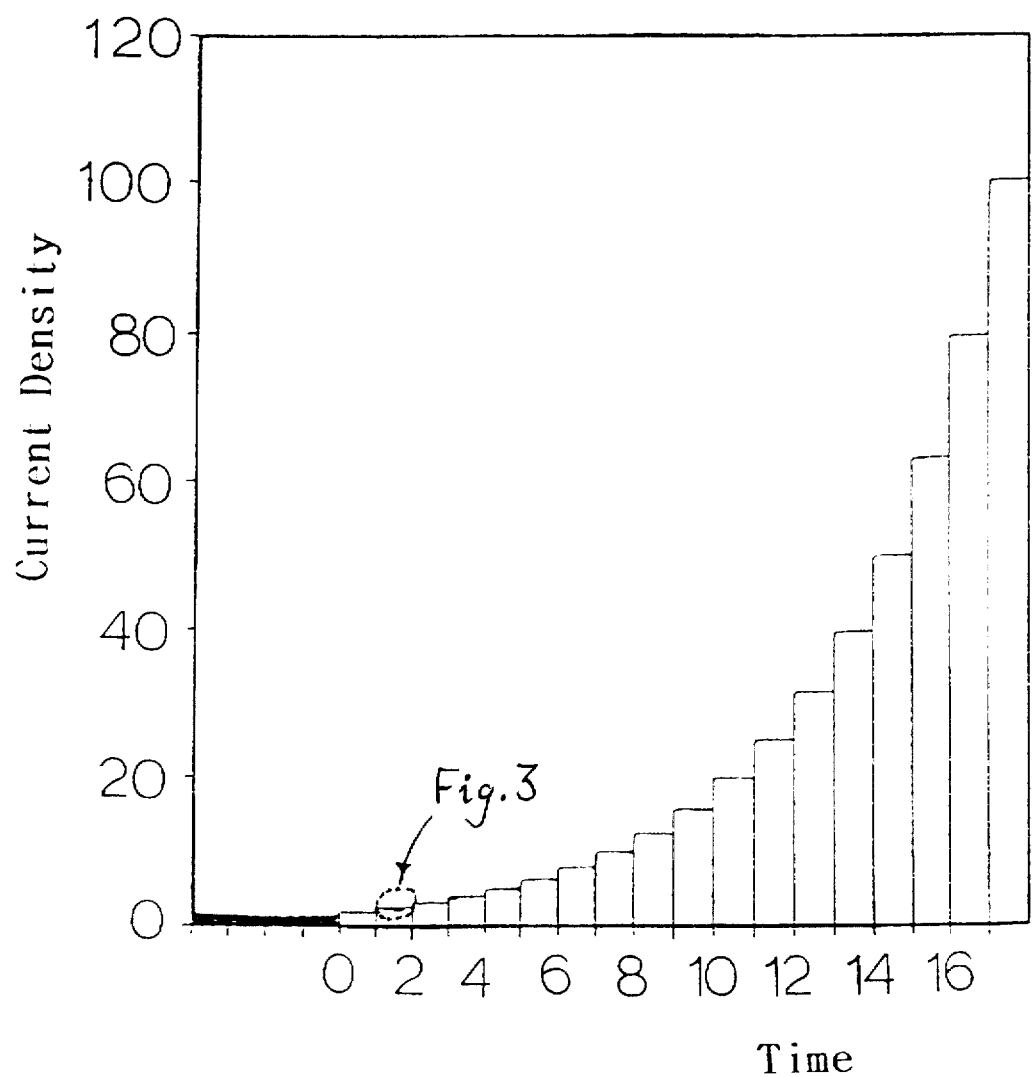
FIG. 2. schematically illustrates a method of testing the reliability of the dielectric film in accordance with a current-increment method of the present invention.

In FIG. 2, is a bar graph with the Current Density measured on the vertical axis and the Time measure on the horizontal axis showing the determination of the reliability of the dielectric film. The height of each bar is the current density value which is applied to the dielectric film at each order, an order being defined as the selected current density applied within a preselected set time-increment. As seen from FIG. 2,the height of each bar or step increases with each new order. Accordingly, as can be understood from FIG. 2 after establishing the current density value in the first order, the current corresponding to this value is applied to the dielectric film. This process is repeated with each order applying a higher current density than the one previously, and is sequentially carried out until the breakdown of the dielectric film.

The degree to which a current is increased, may appropriately be selected depending on the circumstance in any order relative to the previous order. For example, if a current is applied to the dielectric film in the preceding order, the current density to the dielectric film in the next order can be any value greater than that of the previous order.

Figure 3:
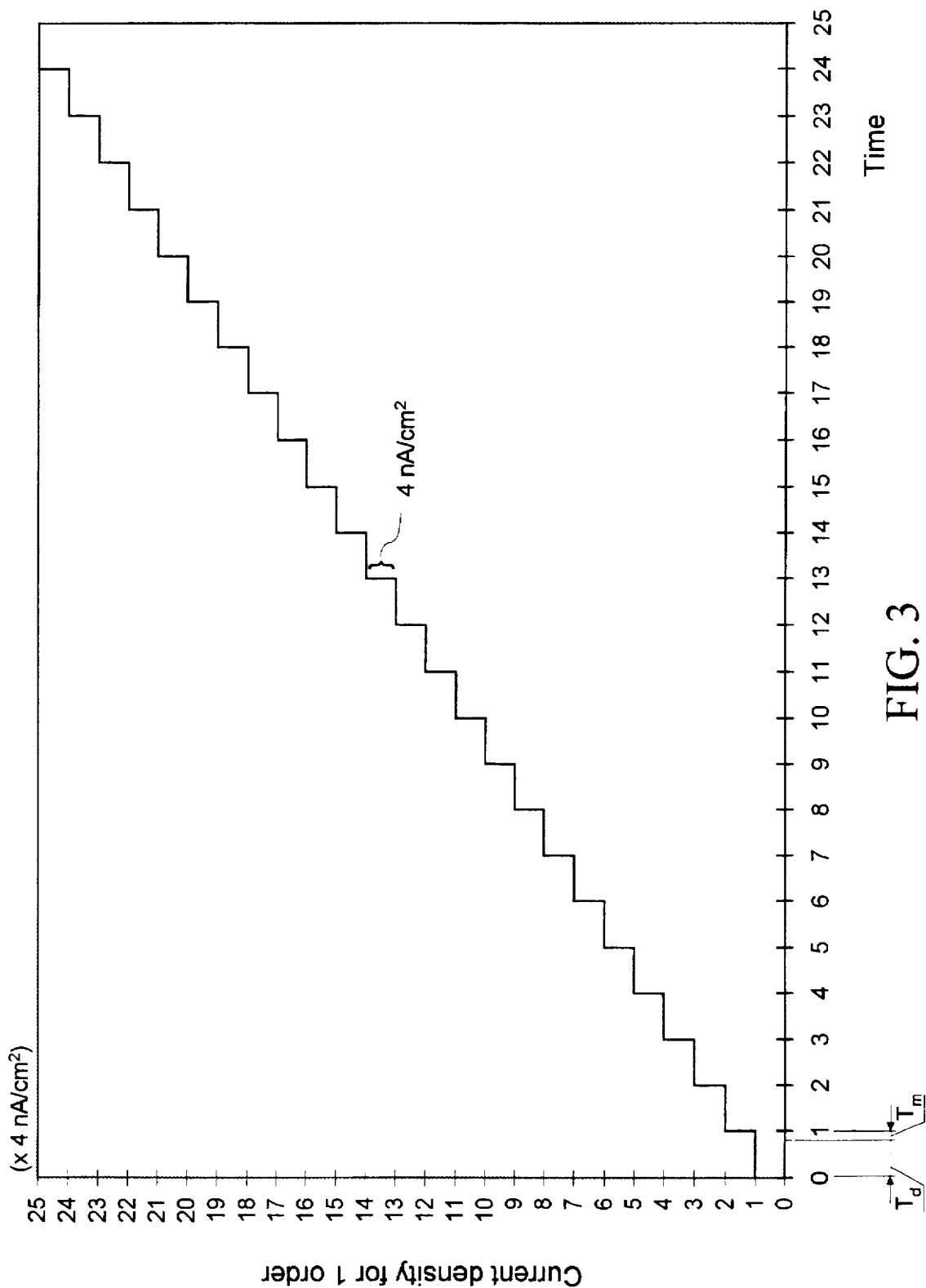
FIG. 3. is a drawing showing that the current of each of the orders is applied in a selected number of increments.

It is also critical in the invention that the amount of current or correspondingly, current density to be applied in each order is divided by a predetermined denominator value yielding a current increment that is applied cumulatively until the full current corresponding to the order is applied. Dividing the current to be applied in an order is shown in FIG. 3. Referring to FIG. 3, the horizontal axis represents the time that it takes to apply the current to the dielectric film for the order, and the vertical axis represents the total amount of the current density applied to the dielectric film for the order. In applying the current to the dielectric film for any order, a delay time is present for a predetermined period of time whenever one-twenty fifth more of the current for an order is applied to the dielectric film. A measurement, thereafter, is carried out for a predetermined period of time on whether the dielectric film is broken down. Thus in reference to FIG. 3, Td represents the delay time and Tm represents the measuring time.

Figure 4:
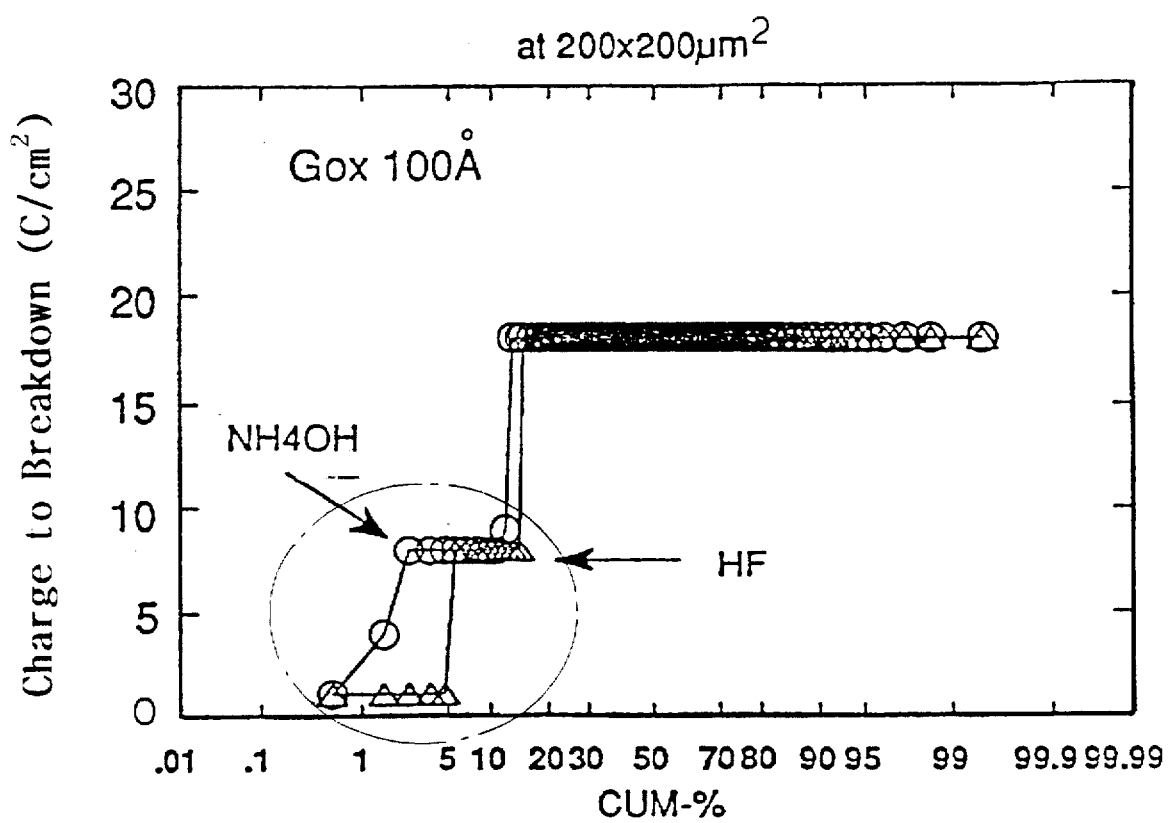
FIG. 4. is a graph showing the results obtained by measuring the charge value at which the dielectric film is broken down in accordance with the first example of the present invention.

FIG. 4 shows the result obtained by using a method according to the first example of this invention wherein the current density to apply to the dielectric film in the first order is fixed to 10nA/cm². The subsequent orders are then carried out until the dielectric breaks down. In the first example of this invention, the current density to be applied in each order is divided by the number 3 to break the order down into three equal steps and the divided value of the current density is applied in three increasing incremental steps to the dielectric film. Meanwhile, whenever the divided value of current is applied, the measurement is carried out as to whether the dielectric film is broken down. Measured results by this example are shown in FIG. 4 by way of illustration. In the graph in FIG. 4, axis x represents cumulative failure percentage in a group of the dielectric film samples, and axis y represents the charge value at which the dielectric film is broken down. Moreover, 100 Å is the thickness of the gate oxide film, and NH$_4$OH and HF are the cleaning solutions which have been used for cleaning the gate oxide film. In FIG. 4, falling within the extrinsic measurements of the dielectric films are the marked results inside of a circle at the lower part of the graph.

However, the marked results at the upper part of the graph, by which the intrinsic measurements of the dielectric film are known, make it difficult to detect the fine difference between the measurements because the results indicate almost similar charge values between them. Accordingly, the method according to the first example can be used roughly to determine the measurements of the initial and average failures of the dielectric film among extrinsic measurements of the dielectric film.

Figure 5:
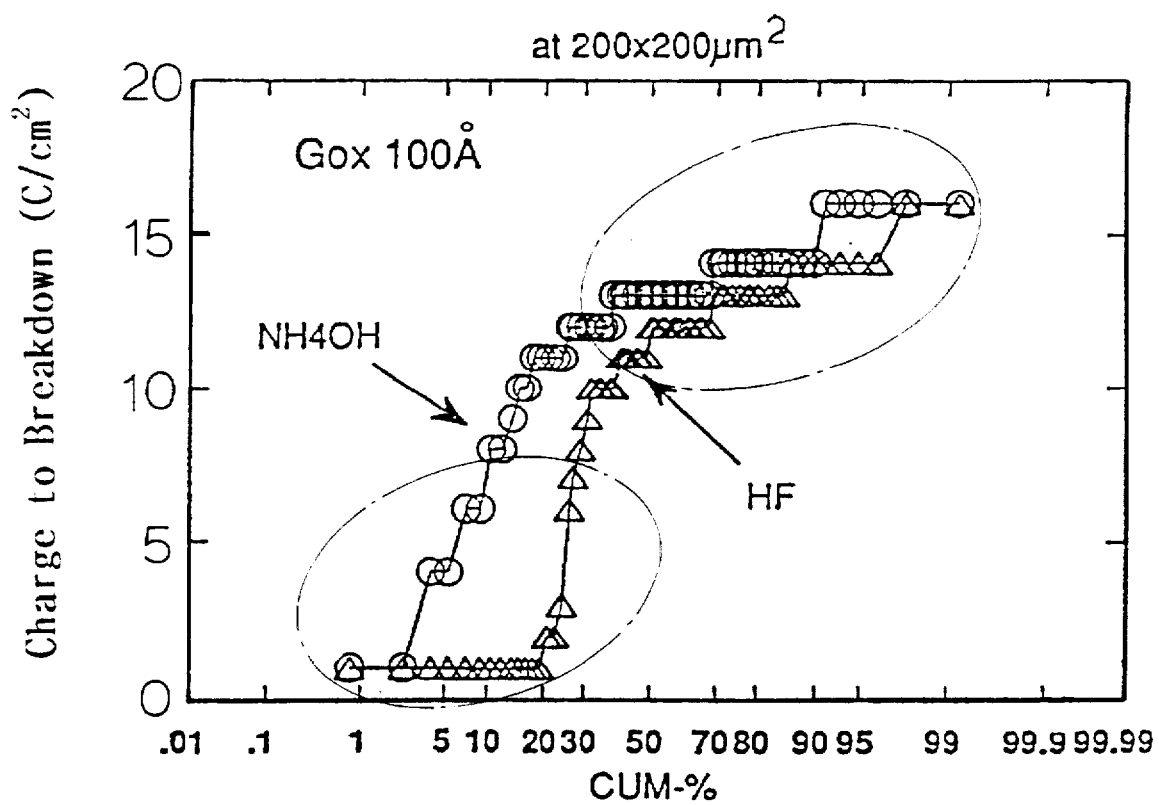
FIG. 5. is a graph showing the results obtained by measuring the charge value at which the dielectric film is broken down in accordance with a second example of the present invention.

FIG. 5 is a graph showing the result obtained by measuring the charge value at which the dielectric film is broken down in accordance with the second example of the present invention wherein the current value to be applied in each order is divided by the number 25 and the divided value of the current is then twenty-five times applied to the dielectric film. Referring to FIG. 5, the symbol ○ represents the result when tested after the gate oxides are treated with NH$_4$OH, and the symbol Δ represents the result when tested after the gate oxides are treated with HF. Moreover, a region defined by an ellipse at the upper portion of the drawing corresponds to the intrinsic failure measurements of the dielectric film, while a region defined by an ellipse at the lower portion corresponds to the extrinsic failure measurements of the dielectric film. As can be seen in FIG. 5, the distinction between the extrinsic failure measurements and the intrinsic failure measurements is clearly made so as to indicate the extrinsic failure measurements of the dielectric film in a precise manner.

Correspondingly, the method according to the second example of the invention, is preferably applied when the extrinsic failure measurements are known with the thickness of the oxide film approximately 70Å. The reason for this method is because when the dielectric film is thin, the extrinsic failure measurements are recognized as the more important data. It is also because the difference between the extrinsic failure measurements facilitate the measurement for the influence undergone during the process or from the surrounding processes. Moreover, among the extrinsic failure measurements, the influence of any defects and the trapping of the pinhole due to the breakdown of the dielectric film itself can be easily detected, and the distinction from the intrinsic failure measurements is clearly made. Therefore, the determination of the dielectric film reliability can be accomplished in a more precise manner.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. Method for measuring at what charge breakdown occurs of a dielectric film deposited on a semiconductor substrate, the dielectric film having a potential relative to a reference point, the method comprising the steps of:

i) establishing a current corresponding to a first order in which current is first applied to the dielectric film;

ii) applying the current corresponding to the first order to the dielectric film;

iii) applying current in subsequent orders until the dielectric film is broken down as determined by a measurement of the potential of the dielectric film; and iv) measuring what charge is carried by the dielectric film when breakdown occurs;

wherein the current corresponding to each subsequent order is applied in a series of substeps by adding cumulatively to the current of the preceding order a predetermined current increment until the applied current is the current of the subsequent order, and wherein the measurement on whether the dielectric film is broken down is carried out at a predetermined time after current of a sub-step is first applied to the dielectric film.

2. The method as claimed in claim 1, wherein the current of the first order is 10 nA/cm².

3. The method as claimed in claim 1, wherein the size of a current increment for a substep in a subsequent order is larger than in a preceding order.

* * * * *